United States Patent
Lee et al.

(10) Patent No.: US 7,852,165 B2
(45) Date of Patent: Dec. 14, 2010

(54) CAPACITIVE-DEGENERATION DOUBLE CROSS-COUPLED VOLTAGE-CONTROLLED OSCILLATOR

(75) Inventors: Ja Yol Lee, Daejeon (KR); Sang Heung Lee, Daejeon (KR); Hae Cheon Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 10 days.

(21) Appl. No.: 12/114,705

(22) Filed: May 2, 2008

(65) Prior Publication Data

US 2009/0134944 A1 May 28, 2009

(30) Foreign Application Priority Data

Nov. 27, 2007 (KR) .................. 10-2007-0121639

(51) Int. Cl.
*H03B 5/12* (2006.01)
(52) U.S. Cl. .................................. 331/117 R
(58) Field of Classification Search ............. 331/117 R, 331/117 FE, 167, 115, 132
See application file for complete search history.

(56) References Cited

U.S. PATENT DOCUMENTS

| 5,379,003 | A | | 1/1995 | Bizen | |
|---|---|---|---|---|---|
| 5,920,235 | A | * | 7/1999 | Beards et al. | 331/108 D |
| 6,466,099 | B2 | | 10/2002 | Festag | |
| 7,170,355 | B2 | * | 1/2007 | Lee et al. | 331/117 R |
| 2005/0001691 | A1 | | 1/2005 | Kim et al. | |
| 2005/0212610 | A1 | | 9/2005 | Brekelmans | |
| 2006/0238266 | A1 | | 10/2006 | Harjani et al. | |
| 2007/0132521 | A1 | * | 6/2007 | Lee et al. | 331/167 |
| 2008/0164957 | A1 | * | 7/2008 | Herbert | 331/36 C |

FOREIGN PATENT DOCUMENTS

| KR | 1020070061233 A | | 6/2007 |
|---|---|---|---|
| WO | WO 2006035372 A1 | * | 4/2006 |

OTHER PUBLICATIONS

Zhan, et al., "Analysis of Emitter Degenerated LC Oscillators Using Bipolar Technologies", May 2003, Circuits and Systems, 2003. ISCAS '03. Proceedings of the 2003 International Symposium on, vol. 1, pp. I-669-I-672.*

(Continued)

*Primary Examiner*—Robert Pascal
*Assistant Examiner*—Ryan Johnson

(57) ABSTRACT

A capacitive-degeneration double cross-coupled voltage-controlled oscillator is provided. The capacitive-degeneration double cross-coupled voltage-controlled oscillator includes a main cross-coupled oscillating unit including an oscillation transistor pair cross-coupled to first and second output nodes of a resonating unit to perform an oscillation operation; and an auxiliary cross-coupled oscillating unit including a positive-feedback transistor pair cross-coupled to the first and second output nodes and the transistor pair of the main cross-coupled oscillating unit and a degeneration capacitance connected between emitters of the positive-feedback transistor pair so as to increase a negative resistance of the main cross-coupled oscillating unit. Accordingly, it is possible to increase a maximum attainable oscillation frequency and to decrease an input capacitance.

13 Claims, 16 Drawing Sheets

OTHER PUBLICATIONS

Hugo Veenstra et al., "A 35.2-37.6GHz LC VCO in a 70/100GHz $f_T/f_{max}$ SiGe Technology", ISSCC 2004/Session 21/RF Potpourri/21.9, 2004 IEEE International Solid-State Circuits Conference, Feb. 2004.

Byunghoo Jung et al., "High-Frequency *LC* VCO Design Using Capacitive Degeneration", IEEE Journal of Solid-State Circuits, vol. 39, No. 12, Dec. 2004, pp. 2359-2370.

Jing-Hong Conan Zhan et al., "A 25-GHz Emitter Degenerated *LC* VCO", IEEE Journal of Solid-State Circuits, vol. 39, No. 11, Nov. 2004, pp. 2062-2064.

Ja-Yol Lee et al., "A 15-GHz 7-channel SiGe:C PLL for 60-GHz WPAN Application", Radio Frequency Integrated Circuits (FRIC) Symposium, 2007 IEEE, Jun. 3-5, 2007, pp. 537-540.

Ja-Yol Lee et al., A 45-to-60-GHz Two-Band SiGe:C VCO for Millimeter-Wave Applications:, 2007 IEEE Radio Frequency Integrated Circuits Symposium, pp. 709-712, Jun. 3-5, 2007.

Jongsik Kim et al., "A Microwave Push-Push VCO with Enhanced Power Efficiency in GaInP/ GaAs HBT Technology," Journal of the Institute of Electronics Engineers of Korea SD, Sep. 2007, pp. 71-80, vol. 44 No. 9.

\* cited by examiner

CAPACITIVE-DEGENERATION DOUBLE CROSS-COUPLED VOLTAGE-CONTROLLED OSCILLATOR

CROSS-REFERENCE TO RELATED APPLICATIONS

This application claims the priority of Korean Patent Application No. 10-2007-121639 filed on Nov. 27, 2007, in the Korean Intellectual Property Office, the disclosure of which is incorporated herein by reference.

BACKGROUND OF THE INVENTION

1. Field of the Invention

The present invention relates to a voltage-controlled oscillator, and more particularly, to a capacitive-degeneration double cross-coupled voltage-controlled oscillator capable of increasing a MAOF (maximum attainable oscillation frequency) and decreasing an input capacitance.

2. Description of the Related Art

Recently, as demands for millimeter-wave band frequency resources increase, associated wire/wireless communication devices have been actively developed.

Particularly, due to an increase in processing speeds of silicon devices, conventional expensive millimeter-wave compound semiconductor monolithic microwave integrated circuit (MMIC) devices are gradually replaced with inexpensive silicon millimeter-wave MMIC devices.

However, only the development of the silicon millimeter-wave MMIC is reported, but performance of the silicon is lower than that of the compound semiconductor MMIC in terms of noise and gain characteristics.

In addition, unlike the compound semiconductor, since the silicon substrate has large loss, the silicon substrate causes serious problems such signal leakage and interference in millimeter-wave band.

Therefore, various circuit design technique for solving the problems of the silicon semiconductor in millimeter-wave band have been researched.

A low noise/low power consumption voltage-controlled oscillator is one of the important components of millimeter-wave band wire/wireless communication system. A voltage-controlled oscillator widely used for a silicon integrated circuit includes an LC resonator and negative resistance cells that are constructed as a simple cross-coupled pair. A negative resistance generated by the cross-coupled pair compensates for a loss of the LC resonator, so that oscillation can be generated and sustained.

However, since the simple cross-coupled pair has a small MAOF and a large input capacitance, the simple cross-coupled pair cannot be easily applied to the millimeter-wave voltage-controlled oscillator.

The MAOF is defined as a frequency at which a negative resistance becomes zero when the negative resistance is increased from a negative region to a positive region. That is, the MAOF is a maximum frequency among frequencies at which the negative resistance occurs. As a result, the voltage-controlled oscillator having an oscillation frequency higher than the MAOF cannot be designed.

In addition, as the input capacitance of the cross-coupled pair is increased, a capacitance, coupling with LC resonator and determining a resonance frequency, is also increased. Therefore, the oscillation frequency is lowered.

Furthermore, since modeling accuracy of active and passive devices including inductor, varactor, and transistor becomes lowered in millimeter-wave band, a voltage-controlled oscillator designed and manufactured by using the simple cross-coupled pair may neither obtain a desired oscillation frequency nor oscillate.

In order to increase the MAOF and decrease the input capacitance of the simple cross-coupled pair, a capacitive-degeneration cross-coupled pair has been developed.

In the capacitive-degeneration cross-coupled pair structure, emitters of cross-coupled pair transistors are connected to each other through a capacitance, or the emitters of the cross-coupled pair transistors are connected to ground through a capacitance. As a result, it is possible to increase the MAOF and decrease the input capacitance of the cross-coupled pair.

Although the capacitive-degeneration cross-coupled pair voltage-controlled oscillator uses the cross-coupled pair structure, the MAOF or input capacitance cannot be satisfactorily improved in comparison with the simple cross-coupled pair.

FIGS. 1A and 1B are circuit diagrams illustrating a conventional simple cross-coupled voltage-controlled oscillator 100.

Referring to FIG. 1A, the conventional voltage-controlled oscillator 100 includes a resonating unit 110 and an oscillating unit 120.

The resonating unit 110 includes a supply voltage $V_{cc}$, first and second inductors $L_r1$ and $L_r2$ commonly connected to the supply voltage $V_{cc}$, and a varactor capacitance $C_r$ and a parasitic resistance $R_r$ which are connected in parallel to the first and second inductors $L_r1$ and $L_r2$.

The oscillating unit 120 includes first and second transistors Q1 and Q2 which are connected to respective ends of the parasitic resistance Rr and of which collectors and bases are cross-coupled to each other and a current source Is connected to emitters of the first and second transistors Q1 and Q2.

FIG. 1B is a circuit diagram illustrating a small-signal equivalent circuit of the simple cross-coupled oscillating unit 120 of FIG. 1A.

In FIG. 1B, $$\beta(\omega) = -j\left(\frac{\omega_T}{\omega}\right)$$

denotes a high-frequency small-signal current gain, and $g_m$, $r_e$, $r_b$, and $i_b$ denote a transconductance, an emitter resistance, an intrinsic base resistance, and a base current of a transistor, respectively.

Input admittances $Y_{in}$, that is, an input resistance $R_{in}$ and an input capacitance $C_{in}$ of the circuit of FIG. 1B can be represented by Equations 1 and 2, respectively.

$$R_{in} = \frac{2(r_b + r_e)^2 + 2\left(\frac{\omega_T}{\omega}\right)^2\left(\frac{1}{g_m} + r_e\right)^2}{(r_b + r_e) - \left(\frac{\omega_T}{\omega}\right)^2\left(\frac{1}{g_m} + r_e\right)} \quad \text{[Equation 1]}$$

$$C_{in} = \frac{\left(\frac{\omega_T}{\omega^2}\right)\left(\frac{1}{g_m} + r_b + 2r_e\right)}{2(r_b + r_e)^2 + 2\left(\frac{\omega_T}{\omega}\right)^2\left(\frac{1}{g_m} + r_e\right)^2} \quad \text{[Equation 2]}$$

Here, $$\omega_T = 2\pi f_T = \frac{g_m}{C_\pi + C_\mu},$$

and $f_T$, $g_m$, $r_b$, and $r_e$ denote a maximum transition frequency, a transconductance, an intrinsic base resistance, and an emitter resistance of a transistor, respectively.

Since the MAOF $f_{trans}$ is a frequency at which a negative resistance becomes zero when an input negative resistance is increased from a negative region to a positive region, the MAOF $f_{trans}$ represented by Equation 3 can be calculated from Equation 1.

$$f_T \sqrt{\frac{r_e + \frac{1}{g_m}}{r_b + r_e}} \qquad \text{[Equation 3]}$$

Since the simple cross-coupled oscillating unit 120 has a simple structure and easily generates a differential signal, the simple cross-coupled oscillating unit 120 is widely used for an integrated circuit. However, as seen in Equation 3, the simple cross-coupled oscillating unit 120 has a problem in that the MAOF $f_{trans}$ is limited due to the intrinsic base resistance $r_b$ of the transistor.

In addition, due to a base-emitter capacitance, a base-collector capacitance, and a base-substrate capacitance of each transistor, the voltage-controlled oscillator of FIG. 1 has such problems as a large input capacitance and a lower oscillation frequency.

In order to solve the above-mentioned problems, a new-type capacitive-degeneration cross-coupled voltage-controlled oscillator capable of increasing the MAOF $f_{trans}$ and decreasing the input capacitance by using a degeneration capacitance has been proposed.

FIG. 2A is a circuit diagram illustrating a conventional capacitive-degeneration cross-coupled voltage-controlled oscillator.

Referring to FIG. 2A, the capacitive-degeneration cross-coupled voltage-controlled oscillator 200 includes a resonating unit 210 and an oscillating unit 220.

The resonating unit 210 includes a supply voltage $V_{cc}$, first and second inductors Lr1 and Lr2 commonly connected to the supply voltage Vcc, and a varactor capacitance Cr and respective ends of the parasitic resistance Rr and of which are connected in parallel to the first and second inductors $L_r1$ and $L_r2$.

The oscillating unit 220 includes first and second transistors Q1 and Q2 which are connected to respective ends of the parasitic resistance $R_r$ and of which collectors and bases are cross-coupled to each other, a degeneration capacitance $C_d$ connected between emitters of the first and second transistors Q1 and Q2, and a current source Is connected to emitters of the first and second transistors Q1 and Q2.

Unlike the simple cross-coupled voltage-controlled oscillator 100 of FIG. 1A, in the capacitive-degeneration cross-coupled voltage-controlled oscillator 200 of FIG. 2A, the degeneration capacitance $C_d$ is connected between the emitters of the first and second transistors Q1 and Q2, so that a negative resistance of the oscillating unit 220 can be increased.

Accordingly, in the capacitive-degeneration cross-coupled voltage-controlled oscillator, since the negative resistance of the oscillating unit 220 can be increased, the increased negative resistance compensates for a loss of the resonating unit 210, so that oscillation can be generated and sustained.

In addition, due to the newly added component, that is, the degeneration capacitance $C_d$, in the oscillating unit 220, the first transistor Q1, the degeneration capacitance $C_d$, and the second transistor Q2 constitutes a positive feedback loop.

Therefore, the input capacitance $C_{in}$ of the oscillating unit 220 can be intuitively represented by Equation 4.

$$\frac{1}{\frac{1}{C_{be2}} + \frac{1}{2C_d}} \text{ or } \frac{1}{\frac{1}{C_{be1}} + \frac{1}{2C_d}} \qquad \text{[Equation 4]}$$

Here, $C_{be}1$ denotes a base-emitter capacitance of the first transistor Q1, and $C_{be}2$ denotes a base-emitter capacitance of the second transistor Q2.

That is, the input capacitance Cin of the oscillating unit 220 of FIG. 2 is inverse proportion to $1/(2Cd)$ due to the degeneration capacitance Cd.

More specifically, input admittances $Y_{in}$, that is, an input resistance $R_{in}$ and an input capacitance $C_{in}$ can be exactly represented by Equations 5 and 6, respectively.

$$R_{in} = \frac{2\left[(r_b + r_e) - \left(\frac{\omega_T}{\omega}\right)\frac{1}{2\omega C_d}\right]^2 + 2\left[\left(\frac{\omega_T}{\omega}\right)\left(\frac{1}{g_m} + r\right) + \frac{1}{2\omega C_d}\right]^2}{(r_b + r_e) - \left(\frac{\omega_T}{\omega}\right)^2\left(\frac{1}{g_m} + r_e + \frac{1}{\omega_T C_d}\right)} \qquad \text{[Equation 5]}$$

$$C_{in} = \frac{\left(\frac{\omega_T}{\omega^2}\right)\left[\left(r_b + 2r_e + \frac{1}{g_m}\right) + \frac{1}{2\omega_T C_d} - \left(\frac{\omega_T}{\omega}\right)\frac{1}{2\omega C_d}\right]}{2\left[(r_b + r_e) - \left(\frac{\omega_T}{\omega}\right)\frac{1}{2\omega C_d}\right]^2 + 2\left[\frac{1}{2\omega C_d} + \left(\frac{\omega_T}{\omega}\right)\left(\frac{1}{g_m} + r_e\right)\right]^2} \qquad \text{[Equation 6]}$$

The MAOF $f_{trans}$ of the capacitive-degeneration cross-coupled oscillating unit 220 represented by Equation 7 can be calculated from Equation 5. As seen in Equation 7, the MAOF $f_{trans}$ is in proportion to a square root of $1/(C_d)$.

$$f_{trans} = f_T \sqrt{\frac{r_e + \frac{1}{g_m} + \frac{1}{\omega_T C_d}}{(r_b + r_e)}} \qquad \text{[Equation 7]}$$

Here, $$\omega_T = 2\pi f_T = \frac{g_m}{C_\pi + C_\mu},$$

and $f_T$, $g_m$, $r_b$, and $r_e$ denote a maximum transition frequency, a transconductance, an intrinsic base resistance, and an emitter resistance of a transistor.

However, the capacitive-degeneration voltage-controlled oscillator 200 has a problem in that the negative resistance disappears when the degeneration capacitance $C_d$ is too small or 0.

In addition, since the capacitive-degeneration voltage-controlled oscillator 200 can adjust the MAOF $f_{trans}$ or the input capacitance $C_{in}$ by using only the degeneration capacitance $C_d$, a satisfactory performance cannot be obtained in comparison with a simple cross-coupled pair voltage-controlled oscillator.

SUMMARY OF THE INVENTION

The present invention provides a voltage-controlled oscillator capable of more effectively increasing a MAOF and decreasing an input capacitance.

The present invention also provides a voltage-controlled oscillator capable of stably operating with overcoming influence of a parasitic resistance and a parasitic capacitance at terahertz band as well as millimeter-wave band.

According to an aspect of the present invention, there is provided a voltage-controlled oscillator comprising: a main cross-coupled oscillating unit including an oscillation transistor pair cross-coupled to first and second output nodes of a resonating unit to perform an oscillation operation; and an auxiliary cross-coupled oscillating unit including a positive-feedback transistor pair cross-coupled to the first and second output nodes and the oscillation transistor pair and a degeneration capacitance connected between emitters of the positive-feedback transistor pair so as to increase a negative resistance of the main cross-coupled oscillating unit.

In the above aspect of the present invention, the main cross-coupled oscillating unit may comprises: first and second transistors of which bases are connected to the respective first and second output nodes of the resonating unit and of which collectors and bases are cross-coupled to each other; and a second current source connected to emitters of the first and second transistors.

In addition, the auxiliary cross-coupled oscillating unit may comprises: a third transistor having a collector connected to the base of the first transistor and a base connected to the emitter of the second transistor; a fourth transistor having a collector connected to the base of the second transistor and a base connected to the emitter of the first transistor; a degeneration capacitance connected between emitters of the third and fourth transistors; and a first current source connected to emitters of the third and fourth transistors. In addition, the resonating unit may comprises: first and second inductors commonly connected to a supply voltage; and first and second NMOS varactors of which sources and drains are commonly connected to a tuning voltage and of which gates are connected to the respective first and second inductors.

In addition, the main cross-coupled oscillating unit may comprises: first and second coupling capacitances connected to the respective first and second output nodes; a first transistor having a base connected to the second output node of the resonating unit and a collector connected to a supply voltage; a second transistor having a base connected to the first output node of the resonating unit and a collector connected to the supply voltage; and a second current source connected to emitters of the first and second transistors.

In addition, the auxiliary cross-coupled oscillating unit may comprise: a third transistor having a collector commonly connected to the base of the first transistor and the first output node and a base connected to the emitter of the second transistor; a fourth transistor having a collector commonly connected to the base of the second transistor and the second output node and a base connected to the emitter of the first transistor; a degeneration capacitance connected between emitters of the third and fourth transistors; and a first current source connected to emitters of the third and fourth transistors. In addition, the resonating unit may comprise: a base bias resistance connected to a base voltage; a center-tapped inductor connected to the base bias resistance; and a varactor capacitance connected in parallel to the center-tapped inductor.

According to another aspect of the present invention, there is provided a voltage-controlled oscillator comprising: a main cross-coupled oscillating unit including an oscillation transistor pair cross-coupled to first and second output nodes of a resonating unit to perform an oscillation operation; and an auxiliary cross-coupled oscillating unit including a positive-feedback transistor pair cross-coupled to the first and second output nodes and the transistor pair of the main cross-coupled oscillating unit so as to increase a negative resistance of the main cross-coupled oscillating unit.

In the above aspect of the present invention, the main cross-coupled oscillating unit may comprise: first and second transistors of which bases are connected to the respective first and second output nodes, and of which collectors and bases are cross-coupled to each other; and a second current source connected to emitters of the first and second transistors.

In addition, the auxiliary cross-coupled oscillating unit may comprise: a third transistor having a collector connected to the base of the first transistor and a base connected to the emitter of the second transistor; a fourth transistor having a collector connected to the base of the second transistor and a base connected to the emitter of the first transistor; and a first current source commonly connected to emitters of the third and fourth transistors. In addition, the auxiliary cross-coupled oscillating unit may comprise: a third transistor having a collector connected to the base of the first transistor and a base connected to the emitter of the second transistor; a fourth transistor having a collector connected to the base of the second transistor and a base connected to the emitter of the first transistor; and first current sources connected to the emitters of the third and fourth transistors, respectively.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENT

Figure 1A:
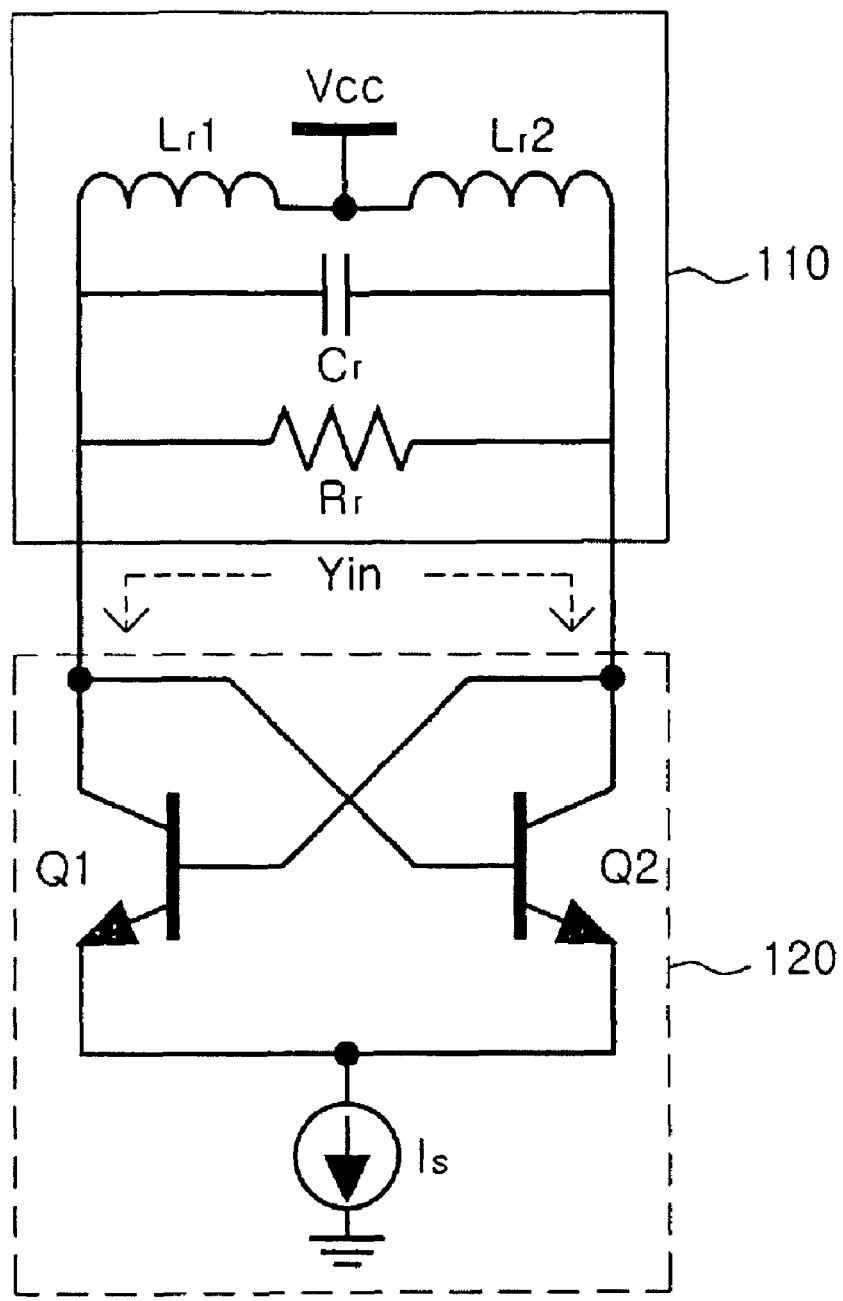
FIG. 1A is a circuit diagram illustrating a conventional simple cross-coupled voltage-controlled oscillator.
Figure 1B:
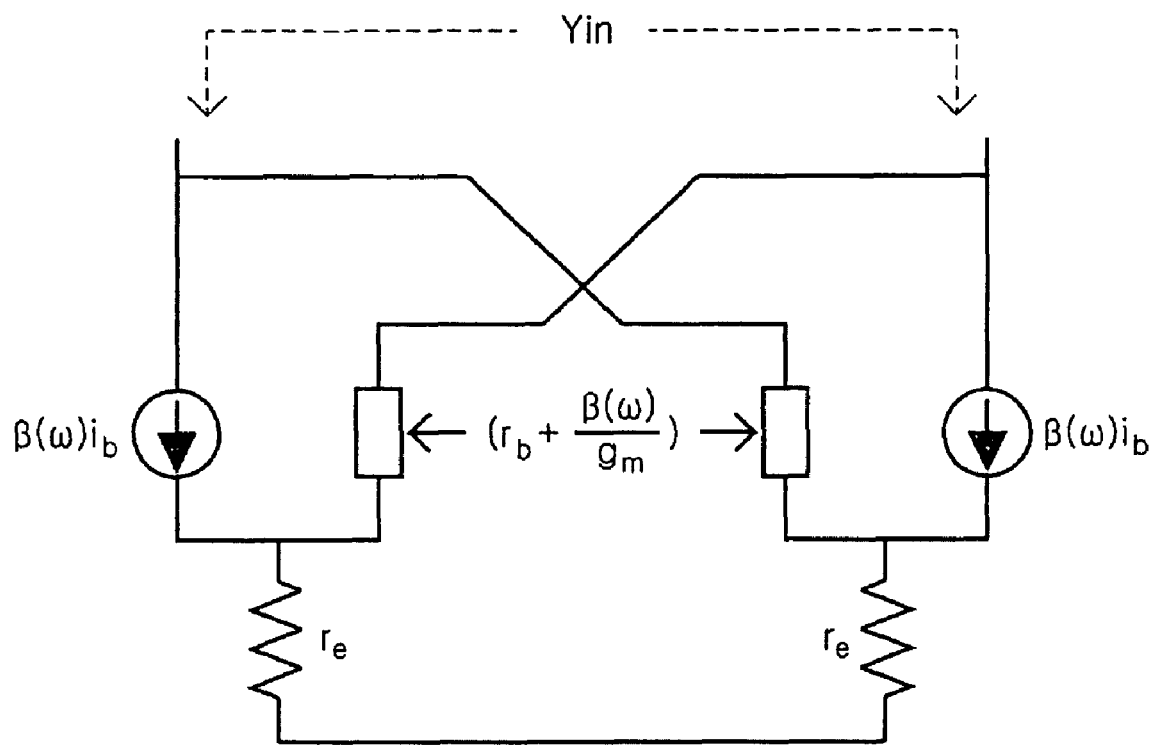
FIG. 1B is a circuit diagram illustrating a small-signal equivalent circuit of a simple cross-coupled oscillating unit of FIG. 1A.
Figure 2A:
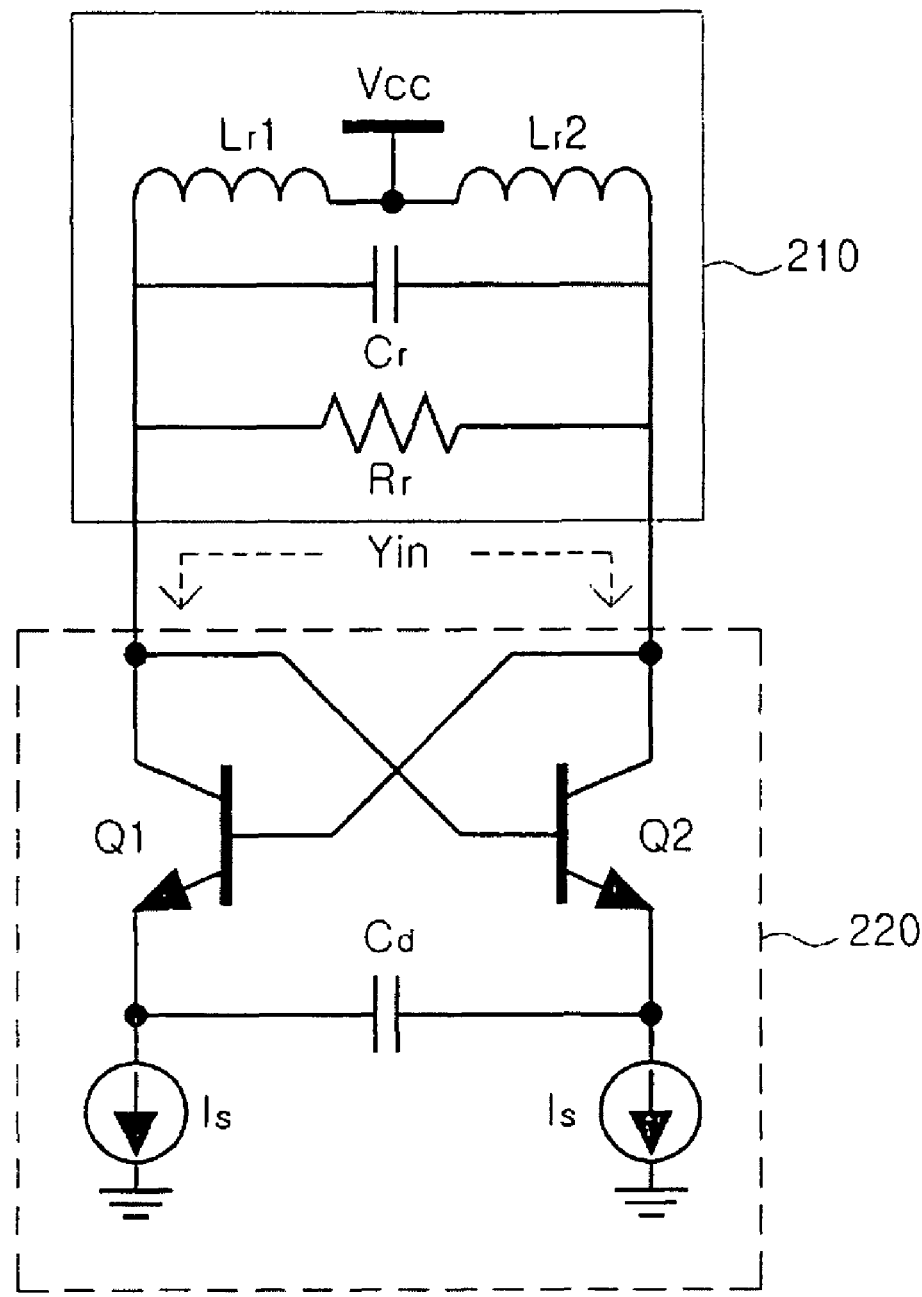
FIG. 2A is a circuit diagram illustrating a conventional capacitive-degeneration cross-coupled voltage-controlled oscillator.
Figure 2B:
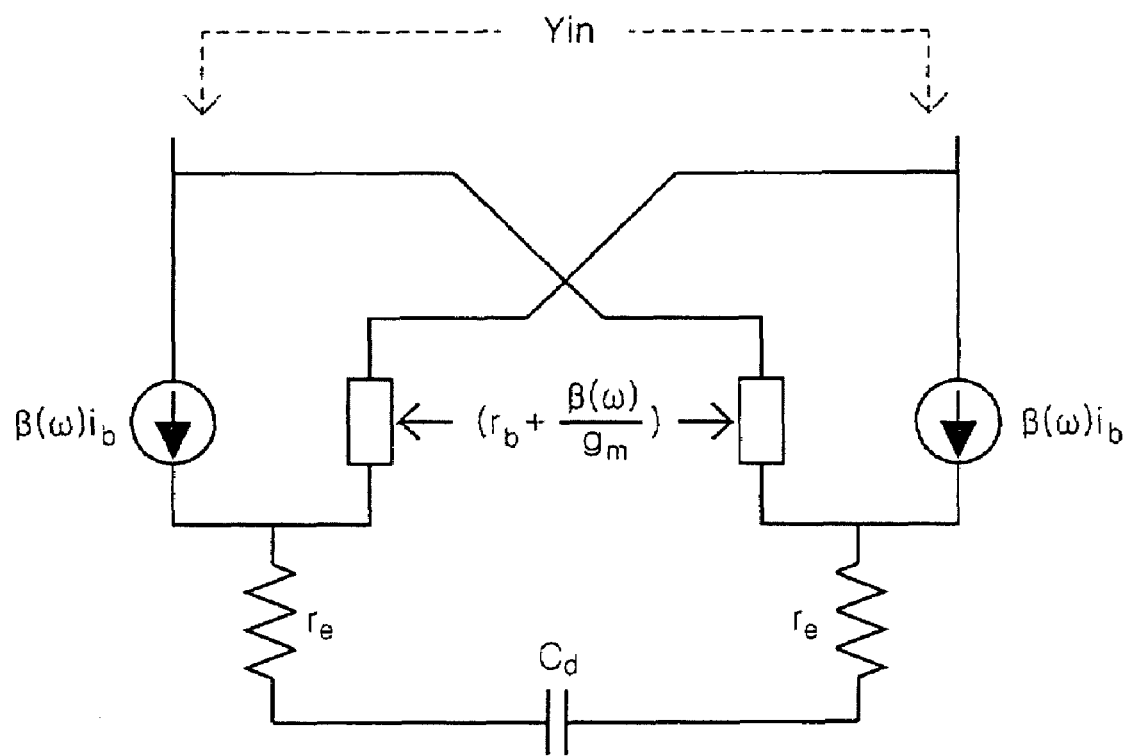
FIG. 2B is a circuit diagram illustrating a capacitive-degeneration cross-coupled oscillating unit of FIG. 2A.

Hereinafter, embodiments of the present invention will be described in detail with reference to the accompanying drawings. For clarifying the present invention, detailed description of well-known functions and constructions will be omitted.

In the accompanying drawing, elements having similar functions and operations are denoted by the same reference numerals.

Figure 3A:
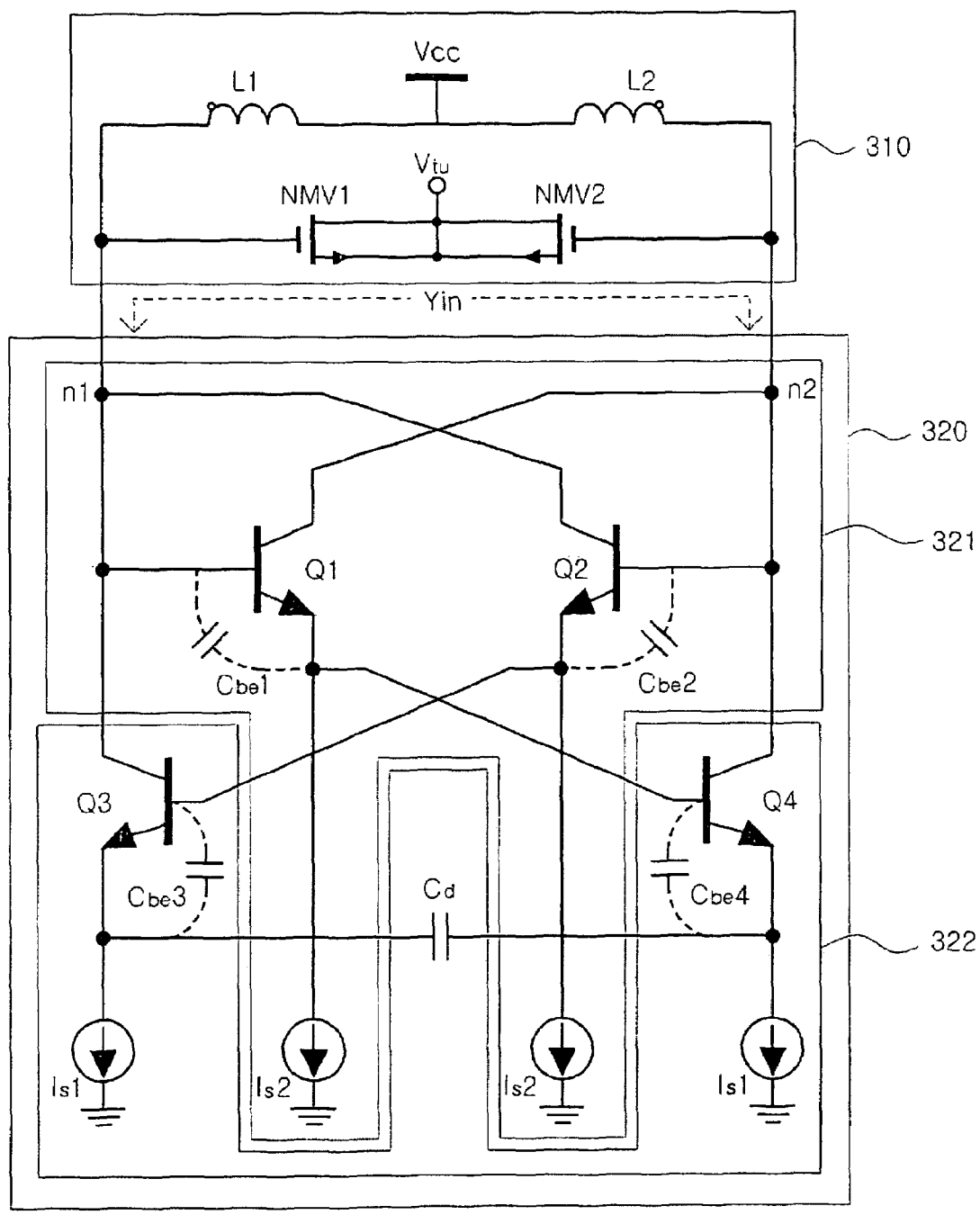
FIG. 3A is a circuit diagram illustrating a capacitive-degeneration double cross-coupled voltage-controlled oscillator according to a first embodiment of the present invention.

FIG. 3A is a circuit diagram illustrating a capacitive-degeneration double cross-coupled voltage-controlled oscillator 300 according to a first embodiment of the present invention.

As shown in FIG. 3A, the capacitive-degeneration double cross-coupled voltage-controlled oscillator 300 includes a resonating unit 310, a main cross-coupled oscillating unit 321, and an auxiliary cross-coupled oscillating unit 322.

The resonating unit 310 determines an oscillation frequency and filters noises. The main cross-coupled oscillating unit 321 performs an oscillation operation including an oscillation transistor pair Q1 and Q2 cross-coupled to first and second output nodes n1 and n2 of the resonating unit 310. And the auxiliary cross-coupled oscillating unit 322 increases a negative resistance of the main cross-coupled oscillating unit 321 including a positive-feedback transistor pair Q3 and Q4 cross-coupled to the transistor pair Q1 and Q2 of the main cross-coupled oscillating unit 321 and the first and second output nodes n1 and n2 of the resonating unit 310 and a degeneration capacitance $C_d$ connected between emitters of the positive-feedback transistor pair Q3 and Q4 to Here, the main cross-coupled oscillating unit 321 and the auxiliary cross-coupled oscillating unit 322 operate as one oscillating unit 320.

More specifically, the resonating unit 310 includes a supply voltage $V_{cc}$, first and second inductors L1 and L2 commonly connected to the supply voltage $V_{cc}$, and two identical first and second NMOS varactors NMV1 and NMV2 of which sources and drains are commonly connected to a tuning voltage $V_{tu}$ and of which gates are connected to the first and second inductors L1 and L2, respectively.

The main cross-coupled oscillating unit 321 includes first and second transistors Q1 and Q2 of which bases are connected to the respective gates of the first and second NMOS varactors NMV1 and NMV2, that is, the respective first and second output nodes n1 and n2 of the resonating unit 310 and of which collectors and bases are cross-coupled to each other and a second current source $I_s2$ connected to emitters of the first and second transistors Q1 and Q2.

The auxiliary cross-coupled oscillating unit 322 includes a third transistor Q3 having a collector connected to the base of the first transistor Q1 and a base connected to the emitter of the second transistor Q2, a fourth transistor Q4 having a collector connected to the base of the second transistor Q2 and a base connected to the emitter of the first transistor Q1, a degeneration capacitance $C_d$ connected between emitters of the third and fourth transistors Q3 and Q4, and a first current source $I_s1$ connected to emitters of the third and fourth transistors Q3 and Q4.

Figure 3B:
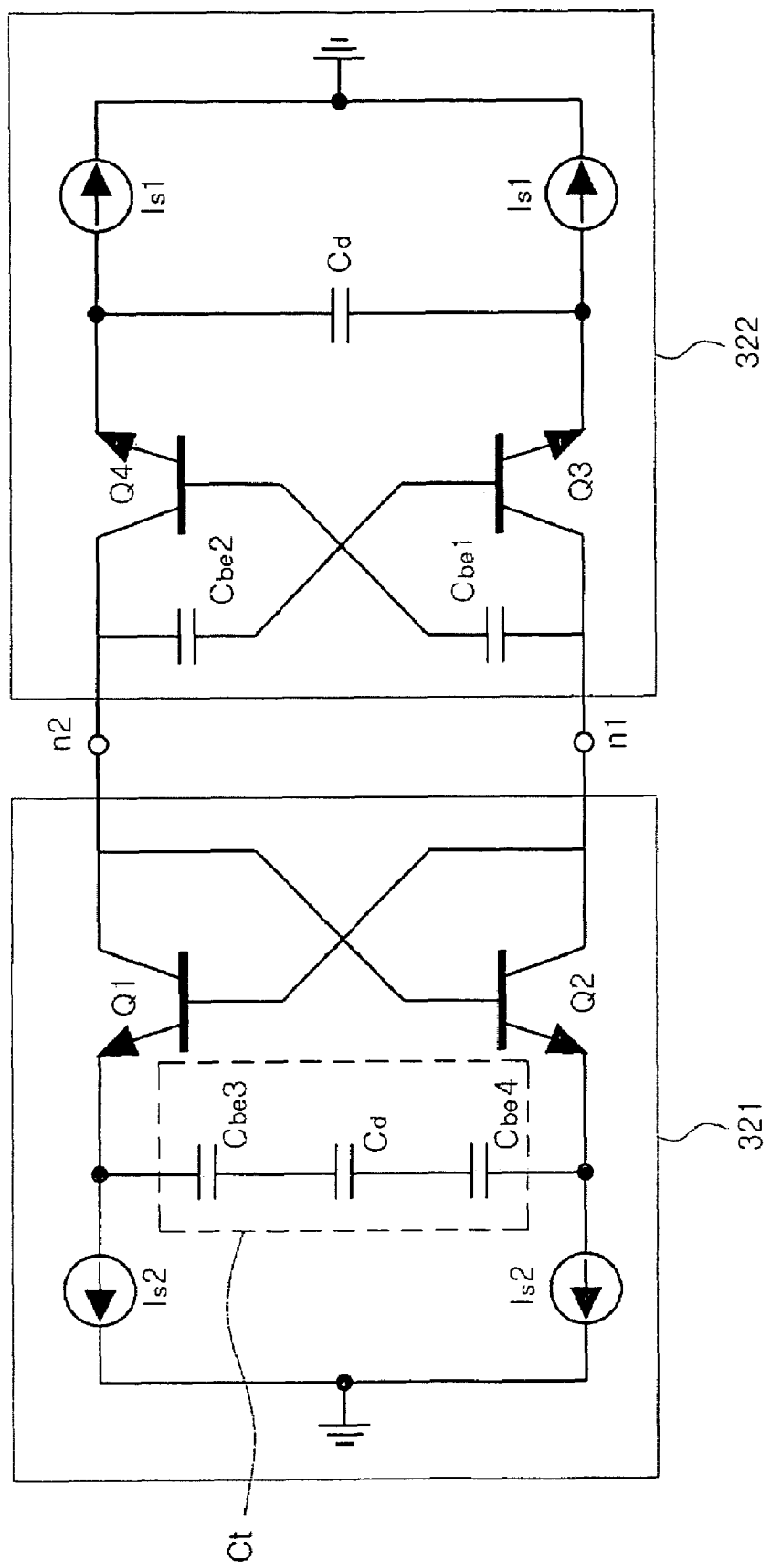
FIG. 3B is a circuit diagram illustrating another expression of the capacitive-degeneration double cross-coupled oscillating unit of FIG. 3A.

The oscillating unit 320 of FIG. 3A can be illustrated by an equivalent circuit of FIG. 3B.

Referring FIG. 3B, the main cross-coupled oscillating unit 321 includes first and second transistors Q1 and Q2 of which collectors and bases are cross-coupled to each other, a degeneration capacitance $C_t$ connected between emitters of the first and second transistors Q1 and Q2, and a second current source $I_s2$ connected the emitters of the first and second transistors Q1 and Q2.

The degeneration capacitance (hereinafter, referred to as main degeneration capacitance) $C_t$ of the main cross-coupled oscillating unit 321 is constructed with a base-emitter capacitance $C_{be}3$ connected in series to the emitters of the first and second transistors Q1 and Q2, a degeneration capacitance (hereinafter, referred to as an auxiliary degeneration capacitance) $C_d$ connected between the emitters of the third and fourth transistors Q3 and Q4, and a base-emitter capacitance $C_{be}4$ of the fourth transistor Q4.

Therefore, the main degeneration capacitance $C_t$ can be represented by Equation 8.

$$\frac{C_\pi C_d}{C_\pi + 2C_d} \qquad \text{[Equation 8]}$$

Here, $C_\pi = C_{be}3 = C_{be}4$.

The auxiliary cross-coupled oscillating unit 322 includes third and fourth transistors Q3 and Q4 of which collectors and bases are cross-coupled to each other via a base-emitter capacitance $C_{be}1$ of the first transistor Q1 and a base-emitter capacitance $C_{be}2$ of the second transistor Q2, and an auxiliary degeneration capacitance $C_d$ connected between emitters of the third and fourth transistors Q3 and Q4, and a first current source $I_s1$ connected to emitters of the third and fourth transistors Q3 and Q4.

In this manner, according to the present invention, the oscillating unit 320 of the capacitive-degeneration double cross-coupled voltage-controlled oscillator 300 has double cross-coupled pairs of transistors.

Therefore, in the oscillating unit 320, the first transistor Q1, the fourth transistor Q4, the auxiliary degeneration capacitance $C_d$, the third transistor Q3, and the second transistor Q2 constitute a positive feedback loop.

As a result, due to the third and fourth transistors Q3 and Q4 and the auxiliary degeneration capacitance $C_d$ of the auxiliary cross-coupled oscillating unit 322, the negative resistance of the main cross-coupled oscillating unit 321 can be further increased, and the input capacitance $C_{in}$ of the oscillating unit 320 can be decreased.

The input capacitance $C_{in}$ of the oscillating unit 320 can be simply represented by Equation 9.

$$\frac{1}{\frac{1}{C_{be1}} + \frac{1}{C_{be4}} + \frac{1}{2C_d}} \text{ or } \frac{1}{\frac{1}{C_{be2}} + \frac{1}{C_{be3}} + \frac{1}{2C_d}} \qquad \text{[Equation 9]}$$

That is, the input capacitance $C_{in}$ of the oscillating unit 320 is in inverse proportion to $$\frac{1}{C_{be2}} + \frac{1}{C_{be3}} + \frac{1}{2C_d}.$$

As a result, the capacitive-degeneration double cross-coupled voltage-controlled oscillator 300 according to the present invention can increase the negative resistance up to a high frequency band and decrease the input capacitance $C_{in}$.

Therefore, in given power consumption, the negative resistance can be obtained in a higher frequency band. In addition, since the input capacitance $C_{in}$ is lowered, a frequency adjustable range can be widened, or signal amplitude can be increased. Accordingly, phase noise can be reduced.

Figure 4A:
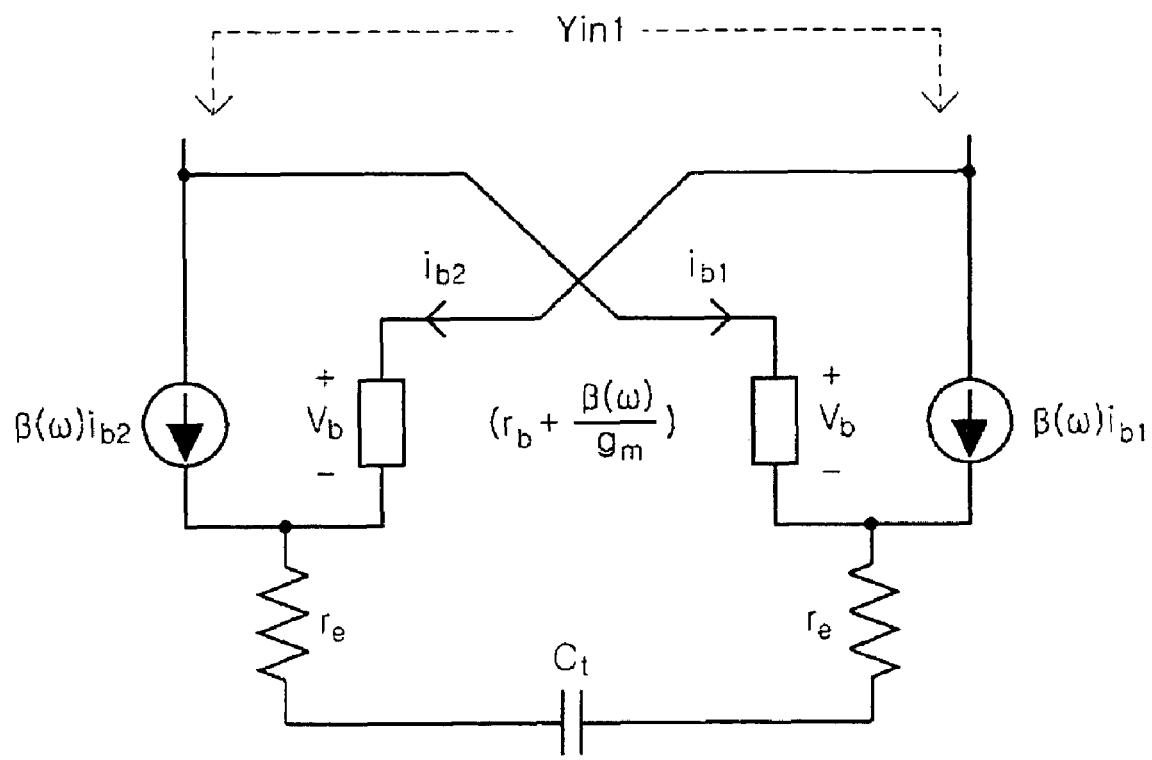
FIG. 4A is a circuit diagram illustrating a small-signal equivalent circuit of a main cross-coupled oscillating unit of FIG. 3A.
Figure 4B:
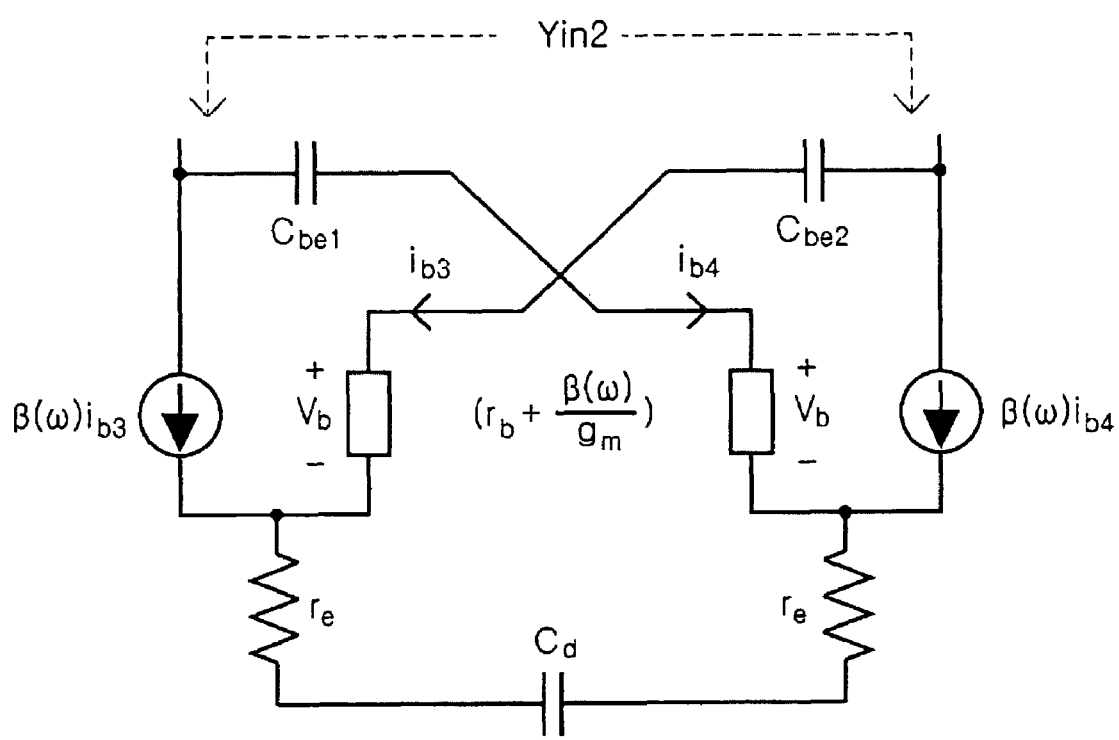
FIG. 4B is a circuit diagram illustrating a small-signal equivalent circuit of an auxiliary cross-coupled oscillating unit of FIG. 3A.

More specifically, the input resistance $R_{in}$ and the input capacitance $C_{in}$ of the double cross-coupled pair oscillating unit 320 can be calculated by using a small-signal equivalent circuit of the main cross-coupled oscillating unit 321 of FIG. 4A and a small-signal equivalent circuit of the auxiliary cross-coupled oscillating unit 322 of FIG. 4B.

The input admittance $Y_{in}$ of the double cross-coupled pair oscillating unit 320 can be calculated by using the input admittance $Y_{in}1$ of main cross-coupled oscillating unit 321 and the input admittance $Y_{in}2$ of the auxiliary cross-coupled oscillating unit 322. As a result, the input admittance $Y_{in}$, that is input resistance $R_{in}$ and the input capacitance $C_{in}$ of the double cross-coupled pair oscillating unit 320 can be represented by Equations 10 and 11, respectively.

$$R_{in} = \frac{1}{\frac{\left[(r_b+r_e)-(\frac{\omega_T}{\omega})^2\left(\frac{1}{g_m}+r_e+\frac{1}{\omega_T C_T}\right)\right]}{2\left[(r_b+r_e)-(\frac{\omega_T}{\omega})\frac{1}{2\omega C_T}\right]^2 +} + \frac{\left[(r_b+r_e)-(\frac{\omega_T}{\omega})^2\left(\frac{1}{g_m}+r_e+\frac{1}{\omega_T C_d}+\frac{1}{\omega_T C_\pi}\right)\right]}{2\left[(r_b+r_e)-(\frac{\omega_T}{\omega})\frac{1}{2\omega C_d}\right]^2 +}} \qquad \text{[Equation 10]}$$

$$C_{in} = \frac{(\frac{\omega_T}{\omega^2})\left[\left(r_b+2r_e+\frac{1}{g_m}\right)+\frac{1}{2\omega_T C_T}-(\frac{\omega_T}{\omega})\frac{1}{2\omega C_T}\right]}{2\left[(r_b+r_s)-(\frac{\omega_T}{\omega})\frac{1}{2\omega C_T}\right]^2 + 2\left[\frac{1}{2\omega C_T}+(\frac{\omega_T}{\omega})\left(\frac{1}{g_m}+r_e\right)\right]^2} + \frac{(\frac{\omega_T}{\omega})\left[\left(r_b+2r_e+\frac{1}{g_m}\right)+\frac{1}{2\omega_T C_d}+\frac{1}{\omega_T C_\pi}-(\frac{\omega_T}{\omega})\frac{1}{2\omega C_d}\right]}{2\left[(r_b+r_e)-(\frac{\omega_T}{\omega})\frac{1}{2\omega C_d}\right]^2 - 2\left[\frac{1}{\omega C_\pi}+\frac{1}{2\omega C_d}+(\frac{\omega_T}{\omega})\left(\frac{1}{g_m}+r_e\right)\right]^2} \qquad \text{[Equation 11]}$$

The MAOF $f_{trans}$ of the capacitive-degeneration double cross-coupled voltage-controlled oscillator 300 according to the present invention can be approximately derived from Equation 10, as represented by Equation 12.

$$f_{trans} \cong f_T \sqrt{\frac{r_e + \frac{1}{g_m} + \frac{1}{\omega_T C_t}}{(r_b + r_e)}} \qquad \text{[Equation 12]}$$

Here, $$\omega_T = 2\pi f_T = \frac{g_m}{C_\pi + C_\mu},$$

and $f_T$, $g_m$, $r_b$, and $r_e$ denote a maximum transition frequency, a transconductance, an intrinsic base resistance, and an emitter resistance of a transistor.

Therefore, according to the present invention, although the MAOF $f_{trans}$ is limited due to the intrinsic base resistance $r_b$ of the transistor, the MAOF $f_{trans}$ is increased in proportion to a square root of $1/(C_t)$.

As a result, as the main degeneration capacitance $C_t$ is decreased, the MAOF $f_{trans}$ is increased.

However, the MAOF $f_{trans}$ is not almost changed according to a change in the auxiliary degeneration capacitance $C_d$ included in the main degeneration capacitance $C_t$.

Since the auxiliary degeneration capacitance $C_d$ is serial connection to the base-emitter capacitances $C_{be3}$ and $C_{be4}$ of the third and forth transistor Q3, Q4, the auxiliary degeneration capacitance $C_d$ does not almost influence the main degeneration capacitance $C_t$.

However, if the auxiliary degeneration capacitance $C_d$ is smaller than the base-emitter capacitance $C_{be}$ of the transistor, the auxiliary degeneration capacitance $C_d$ can influence the main degeneration capacitance $C_t$.

Figure 5A:
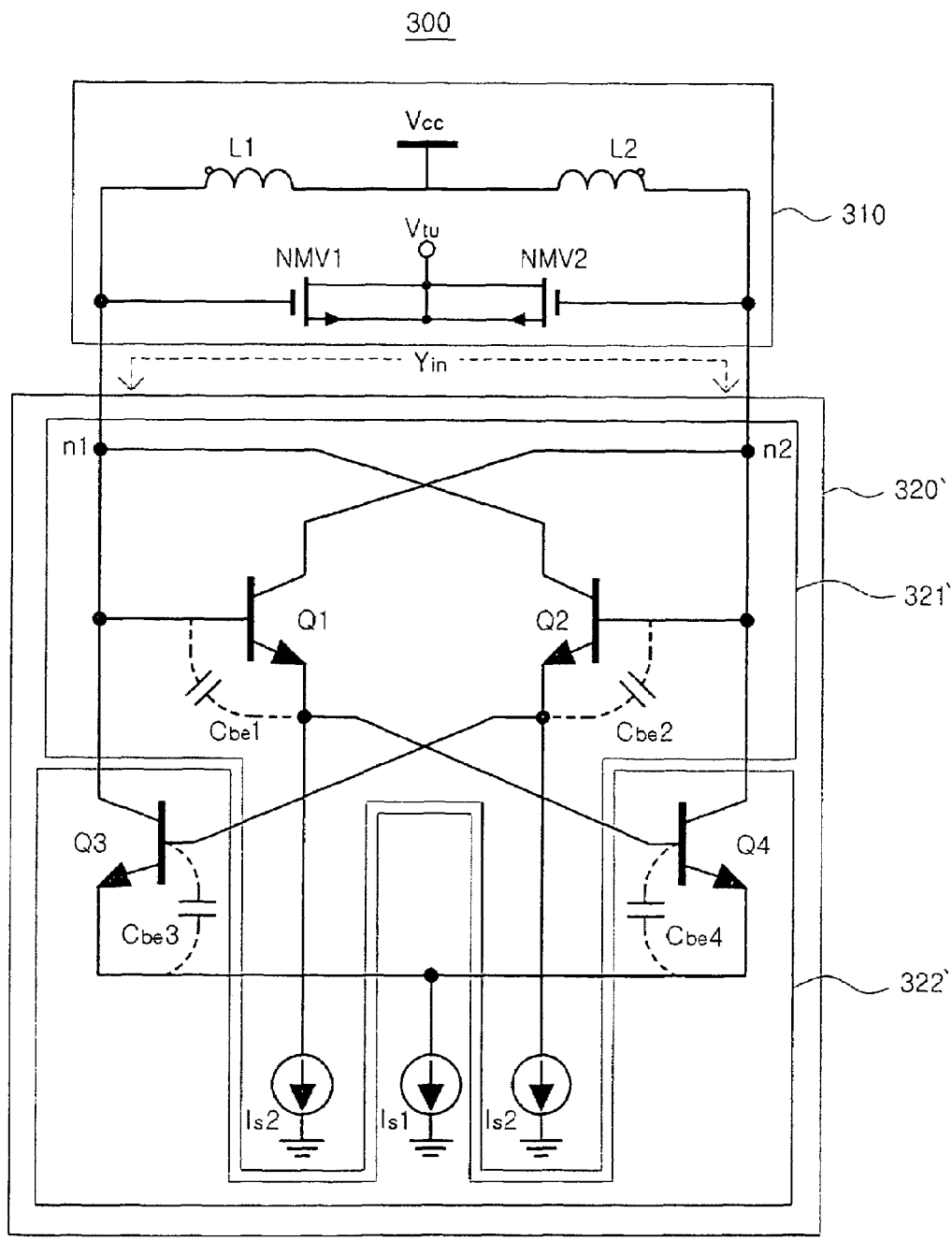
FIG. 5A is a circuit diagram illustrating a capacitive-degeneration double cross-coupled voltage-controlled oscillator according to a second embodiment of the present invention.
Figure 5B:
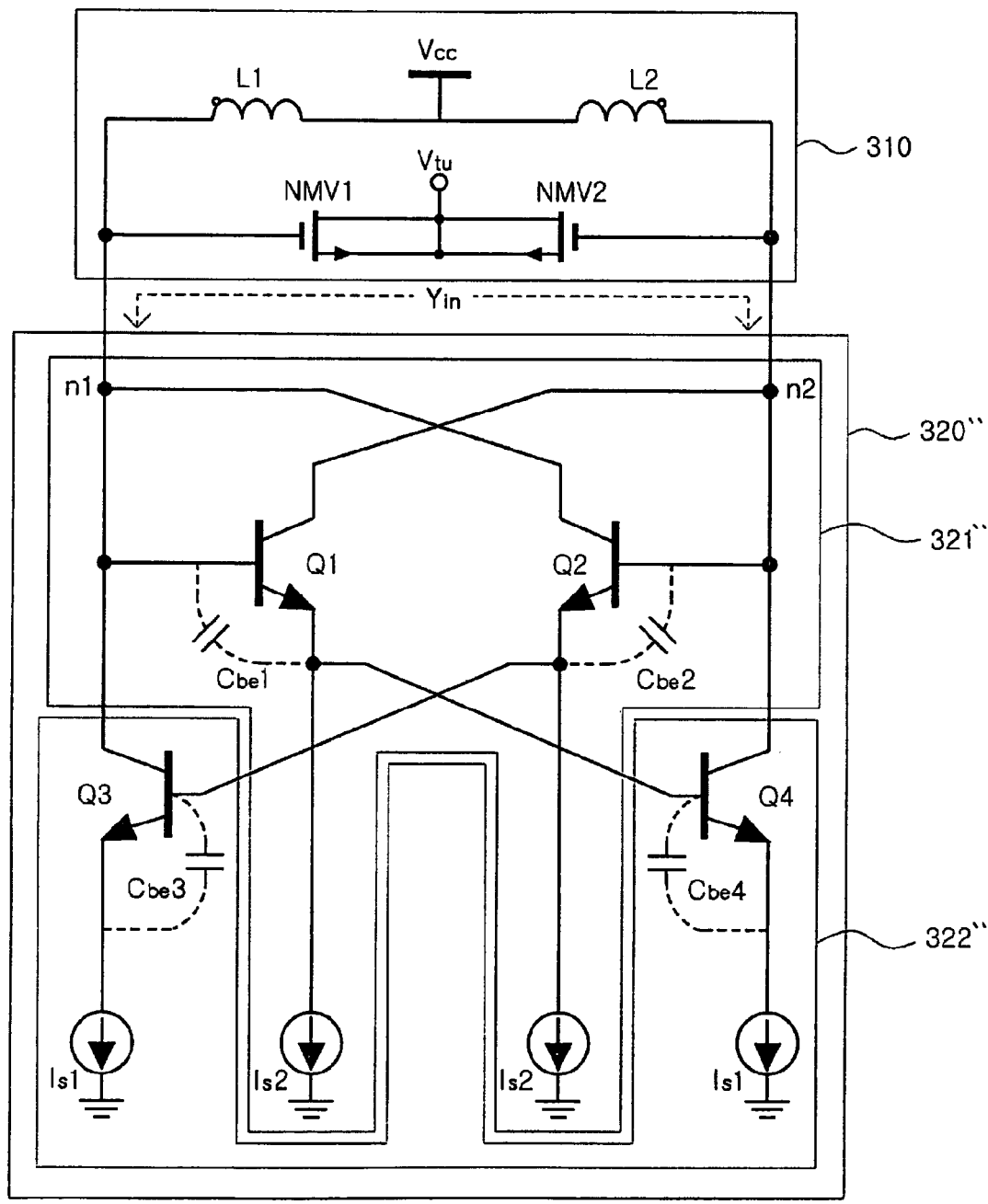
FIG. 5B is a circuit diagram illustrating a capacitive-degeneration double cross-coupled voltage-controlled oscillator according to a third embodiment of the present invention.

FIG. 5A and FIG. 5B are circuit diagrams illustrating a capacitive-degeneration double cross-coupled voltage-controlled oscillator according to a second and third embodiment of the present invention.

As shown in FIG. 5A, the auxiliary degeneration capacitance $C_d$ is not provided, and the emitters of the third and fourth transistors Q3 and Q4 are short-circuited.

However, emitters of the first and second transistors Q1 and Q2 of the main cross-coupled oscillating unit 321' can be degenerated due to serial connection of each of the base-emitter capacitances of the third and fourth transistors Q3 and Q4.

Similarity, as shown in FIG. 5B, the auxiliary degeneration capacitance $C_d$ is not provided, and emitters of the third and fourth transistors Q3 and Q4 of the auxiliary cross-coupled oscillating unit 322'' is open-circuited as shown in FIG. 5B.

However, emitters of the first and second transistors Q1 and Q2 of the main cross-coupled oscillating unit 321'' can be degenerated due to serial connection of each of the base-emitter capacitances of the third and fourth transistors Q3 and Q4 and the input capacitance of the current source $I_s1$. According to a simulation result, the MAOF has the highest value.

Therefore, even in a case where the auxiliary degeneration capacitance $C_d$ becomes small or zero, the voltage-controlled oscillator can be stably operated.

In this manner, according to the capacitive-degeneration double cross-coupled voltage-controlled oscillator of the present invention, it is possible to increase the MAOF $f_{trans}$ and decrease the input capacitance. In addition, the voltage-controlled oscillator can be stably operated even in a case where the degeneration capacitance $C_d$ becomes small or zero.

If needed, the structure of the capacitive-degeneration double cross-coupled voltage-controlled oscillator may be modified so as to directly obtain an output of the oscillator through the first and second transistors Q1 and Q2 of the main cross-coupled oscillating unit.

Figure 6:
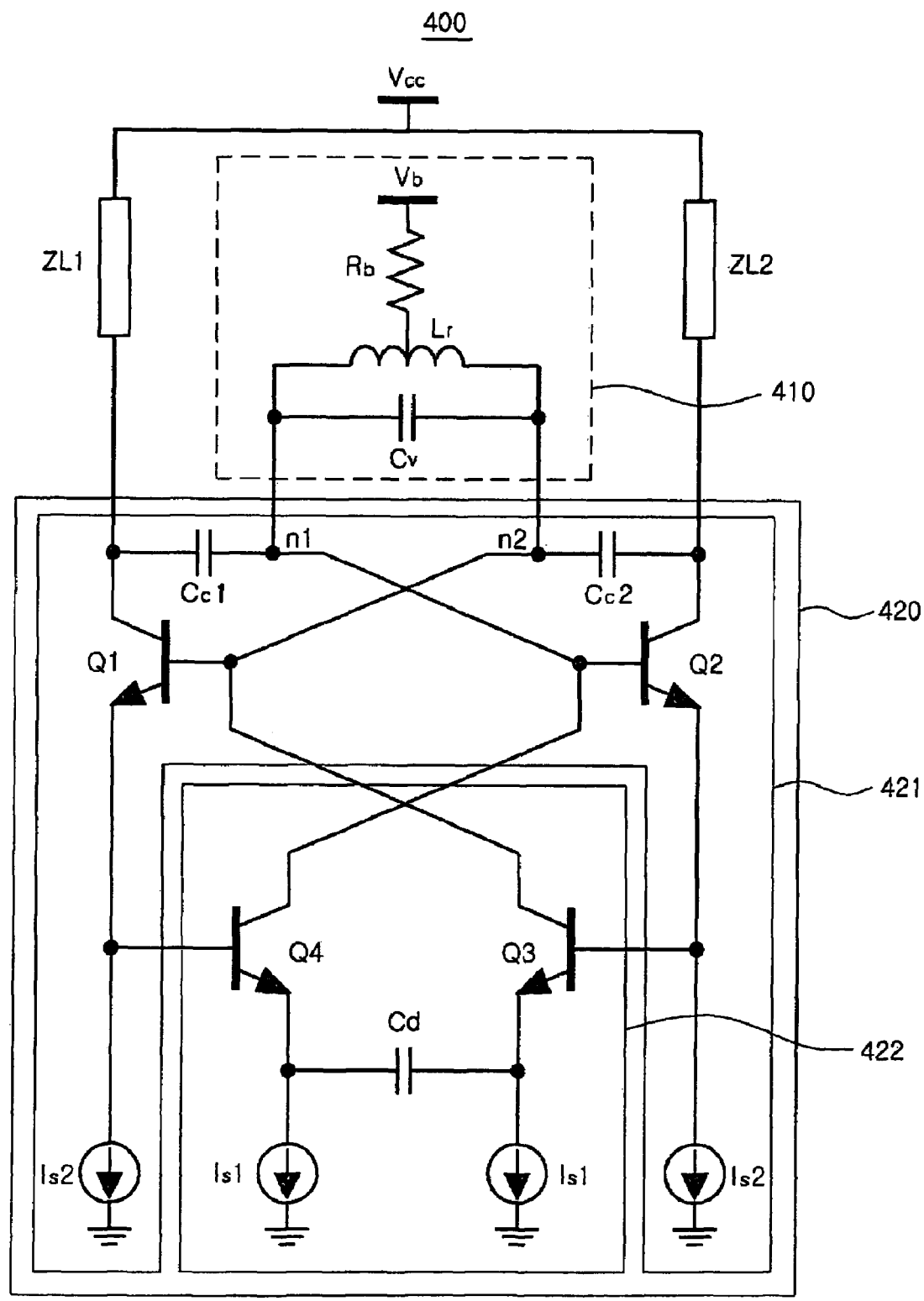
FIG. 6 is a circuit diagram illustrating a capacitive-degeneration double cross-coupled voltage-controlled oscillator according to a fourth embodiment of the present invention.

FIG. 6 is a circuit diagram illustrating a capacitive-degeneration double cross-coupled voltage-controlled oscillator 400 according to a fourth embodiment of the present invention.

Referring to FIG. 6, similarly to the voltage-controlled oscillator 300 of FIG. 5, the voltage-controlled oscillator 400 includes a resonating unit 410, a main cross-coupled oscillating unit 421, and an auxiliary cross-coupled oscillating unit 422. However, detailed constructions of those are different from the voltage-controlled oscillator 300.

More specifically, the resonating unit 410 includes a base bias resistance $R_b$ connected to a base voltage $V_b$, a center-tapped inductor $L_r$ connected to the base bias resistance $R_b$, and a varactor capacitance $C_v$ connected parallel to the center-tapped inductor $L_r$.

The main cross-coupled oscillating unit 421 includes two coupling capacitances $C_c1$ and $C_c2$ connected to respective ends of the varactor capacitance $C_v$ (that is, the respective first and second output nodes n1 and n2 of the resonating unit 410), a first transistor Q1 having a base connected to the second output node n2 and a collector connected through a first load impedance ZL1 to a supply voltage $V_{cc}$, a second transistor Q2 having a base connected to the first output node n1 and a collector connected through a second load impedance ZL2 to the supply voltage Vcc, and a second current source Is2 connected to emitters of the first and second transistors Q1 and Q2. The auxiliary cross-coupled oscillating unit 422 includes a third transistor Q3 having a collector commonly connected to the base of the first transistor Q1 and the second output node n2 and a base connected to the emitter of the second transistor Q2, a fourth transistor Q4 having a collector commonly connected to the base of the second transistor Q2 and the first output node n1 and a base connected to the emitter of the first transistor Q1, a degeneration capacitance $C_d$ connected between emitters of the third and fourth transistors Q3 and Q4, and a first current source $I_s1$ connected to emitters of the third and fourth transistors Q3 and Q4.

In this manner, the oscillating unit 420 of FIG. 6 comprises the main cross-coupled oscillating unit 421 and the auxiliary cross-coupled oscillating unit 422, and has double cross-coupled pairs of transistors.

Therefore, in the oscillating unit 420, the first transistor Q1, the third transistor Q3, the degeneration capacitance $C_d$, the fourth transistor Q4, and the second transistor Q2 constitute a positive feedback loop.

As a result, due to the third and fourth transistors Q3 and Q4 of the auxiliary cross-coupled oscillating unit 422 and the degeneration capacitance $C_d$ connected between the emitters of the third and fourth transistors Q3 and Q4, the negative resistance of the main cross-coupled oscillating unit 421 can be further increased, and the input capacitance $C_{in}$ of the oscillating unit 420 can be decreased.

In the main cross-coupled oscillating unit 421 of the oscillating unit 420, the bases and the collectors of the first and second transistors Q1 and Q2 are electrically separated from each other by the coupling capacitances $C_c1$ and $C_c2$, respectively, so that output signals can be directly extracted from each of the collectors of the first and second transistors Q1 and Q2.

Figure 7A:
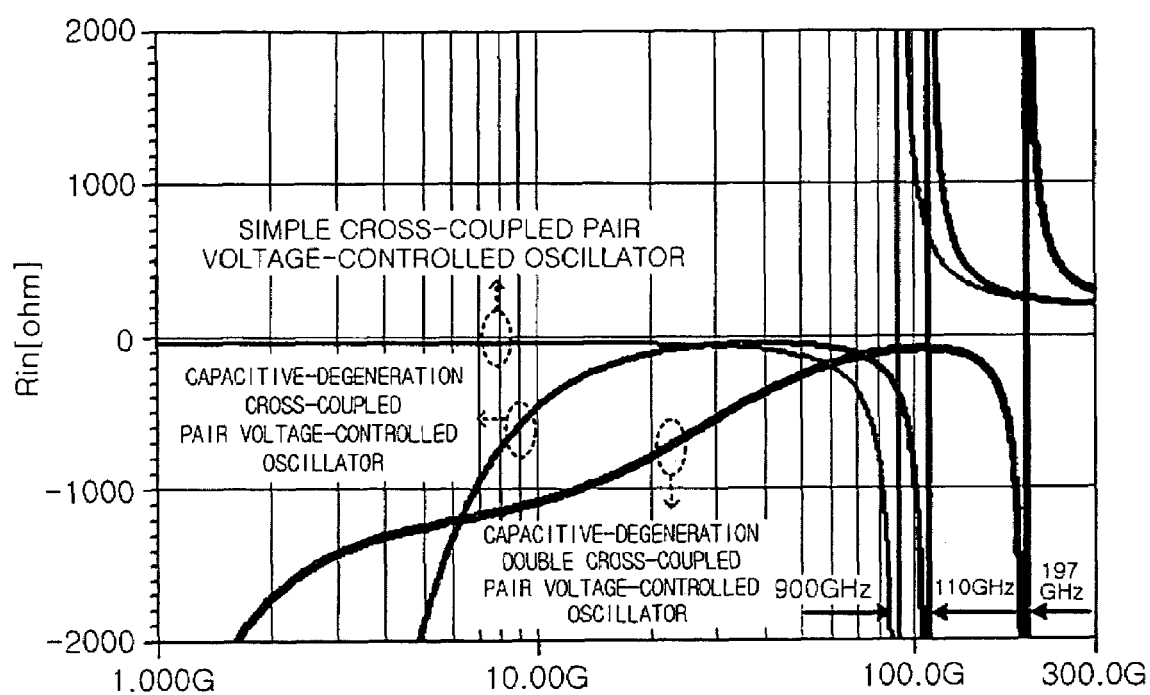
FIGS. 7A and 7B are graphs for explaining operational performance of the capacitive-degeneration double cross-coupled voltage-controlled oscillator according to the fourth embodiment of the present invention.
Figure 7B:
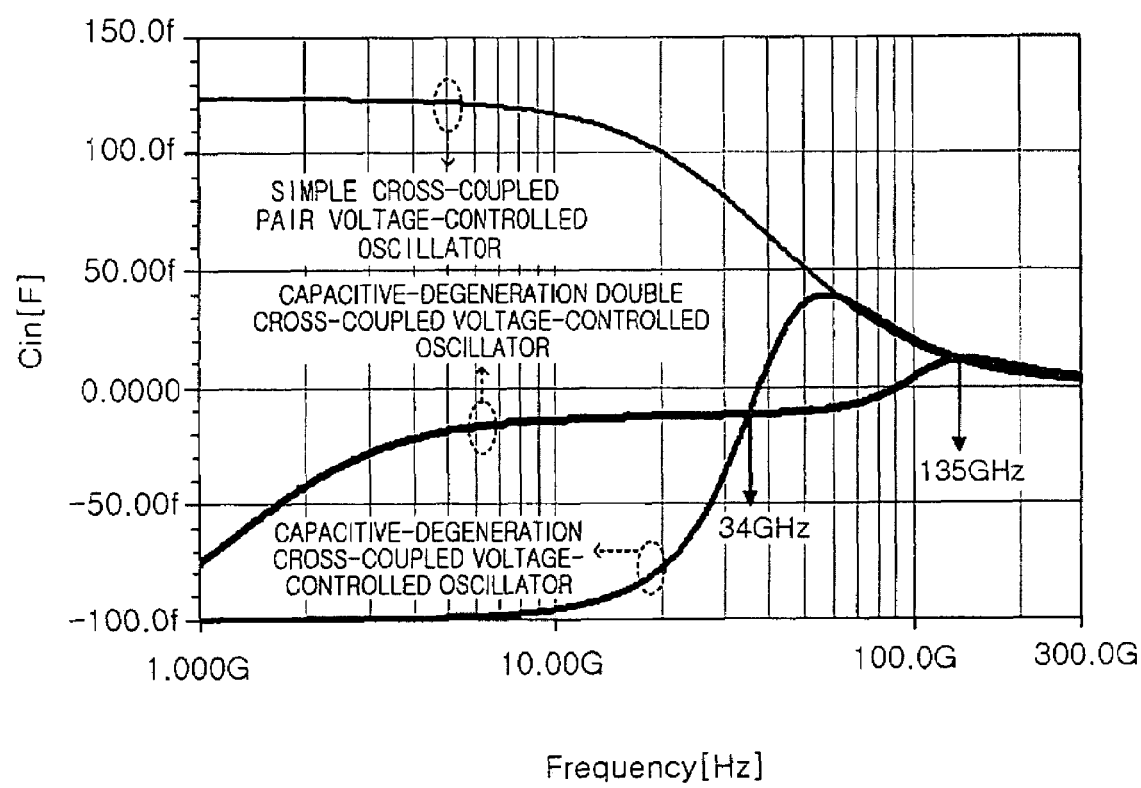

FIGS. 7A and 7B are graphs for explaining operational performance of the capacitive-degeneration double cross-coupled voltage-controlled oscillator according to the fourth embodiment of the present invention. FIG. 7A is a graph of modeling of Equations 1, 5, and 10 of the input resistances $R_{in}$ of the input admittance $Y_{in}$ (=$1/R_{in}$+$j\omega C_{in}$) of the aforementioned oscillating units. FIG. 7B is a graph of modeling of Equations 2, 6, and 11 of the input capacitances $C_{in}$ thereof.

Referring to FIG. 7A, it can be seen that the MAOF of the capacitive-degeneration double cross-coupled voltage-controlled oscillator according to the present invention is 197 GHz, but the maximum attainable oscillation frequencies of the simple cross-coupled voltage-controlled oscillator and the capacitive-degeneration voltage-controlled oscillator are 90 GHz and 110 GHz, respectively, in the same conditions and parameters of equivalent circuits.

That is, it can be understood from Equations 1, 5, and 10 that the capacitive-degeneration double cross-coupled voltage-controlled oscillator can provide the MAOF that is almost twice the maximum attainable oscillation frequencies of the conventional voltage-controlled oscillators.

Referring to FIG. 7B, the capacitive-degeneration double cross-coupled voltage-controlled oscillator has the lowest input capacitance in a range of 34 GHz to 135 GHz, that is, in millimeter-wave band.

As described above, this is because the input capacitance of the oscillating unit 320 is decreased due to the serial connection of the base-emitter capacitance $C_{be}2$ of the second transistor Q2, the base-emitter capacitance $C_{be}3$ of the third transistor Q3, and the degeneration capacitance $C_d$ or due to the serial connection of the base-emitter capacitance $C_{be}1$ of the first transistor Q1, the base-emitter capacitance $C_{be}4$ of the fourth transistor Q4, and the degeneration capacitance $C_d$.

Figure 8:
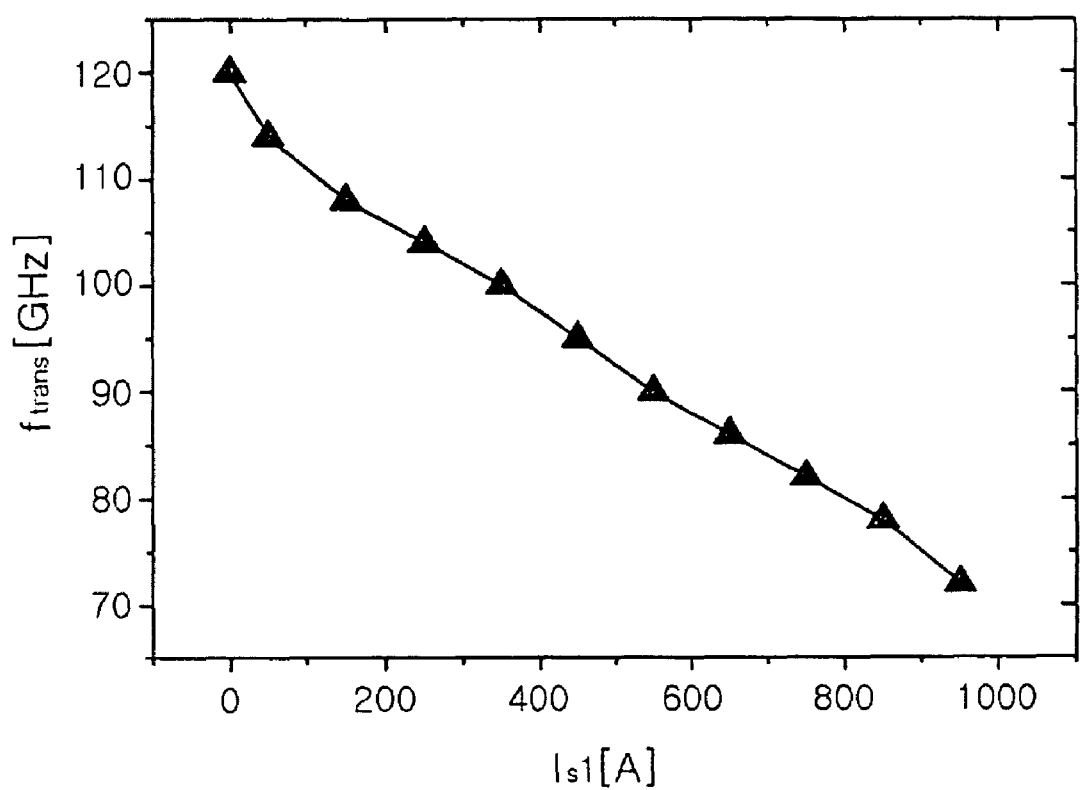
FIG. 8 is a graph illustrating a simulation result of a change in MAOF of a double cross-coupled oscillating unit when a current of a first current source of the auxiliary cross-coupled oscillating unit according to the first embodiment of the present invention is changed from 0 A to 1 mA.

FIG. 8 is a graph illustrating a simulation result of a change in MAOF of a double cross-coupled oscillating unit when a current of a first current source of the auxiliary cross-coupled oscillating unit according to the first embodiment of the present invention is changed from 0 A to 1 mA.

Referring to FIG. 8, it can be seen that the MAOF $f_{trans}$ has the highest value when the first current source $I_s1$ has a value of 0. That is, the auxiliary cross-coupled oscillating unit 322 according to the present invention can increase the MAOF $f_{trans}$ without power consumption.

According to the present invention, since the positive feedback loop including the auxiliary cross-coupled oscillating unit 322 additionally provides the negative resistance to the main cross-coupled oscillating unit 321 without additional power consumption, the MAOF can be increased, and the input capacitance can be decreased, so that the phase noise can be reduced.

Figure 9:
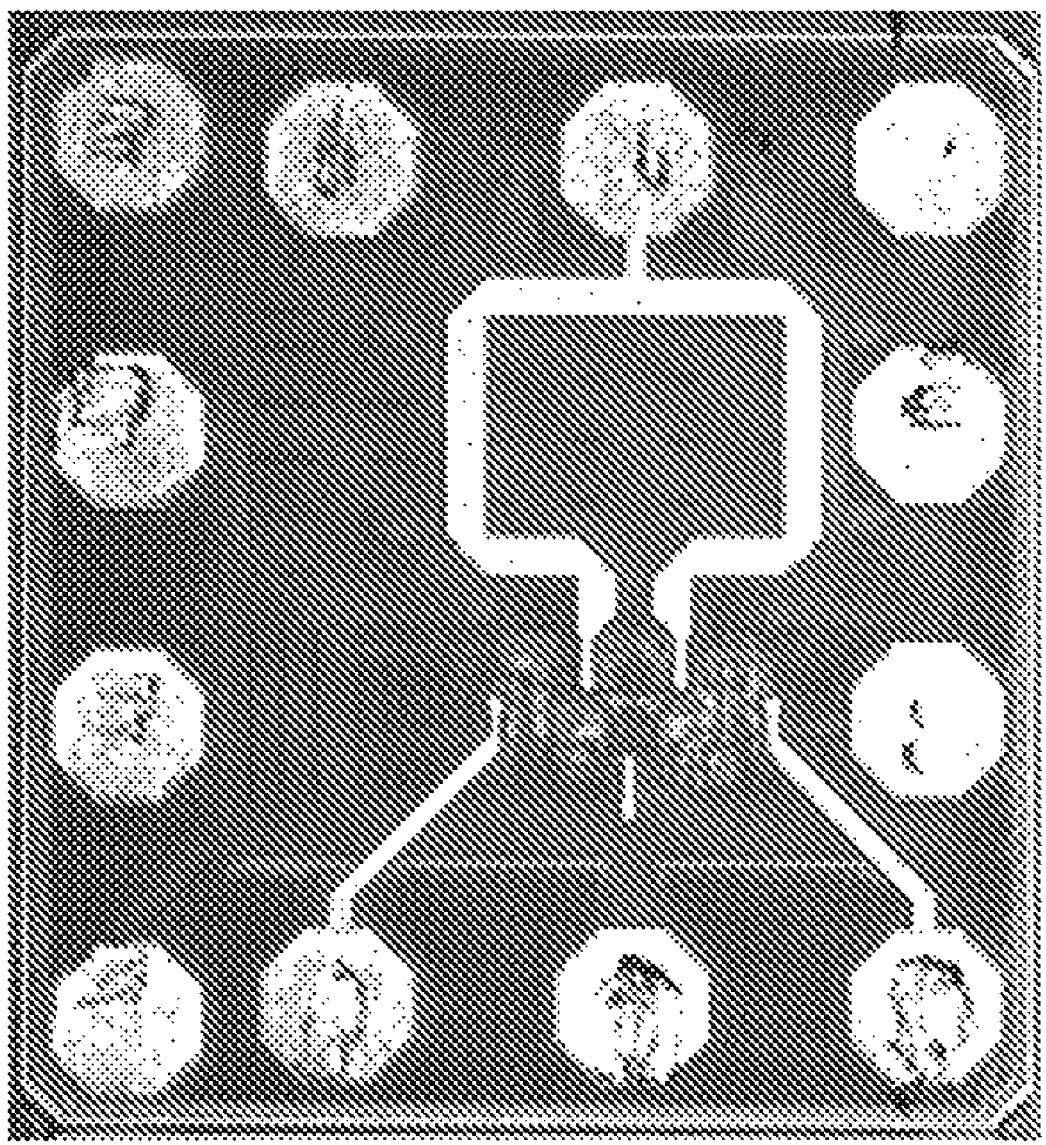
FIG. 9 is a view illustrating an implementation example of the capacitive-degeneration double cross-coupled voltage-controlled oscillator according to the first embodiment of the present invention.

FIG. 9 is a view illustrating an implementation example of the capacitive-degeneration double cross-coupled voltage-controlled oscillator of FIG. 3A.

Referring to FIG. 9, it can be seen that the capacitive-degeneration double cross-coupled voltage-controlled oscillator according to the present invention can be implemented with a size of 0.5×0.5 mm$^2$ by using a 0.25 μm SiGe BiCMOS process.

The implemented capacitive-degeneration double cross-coupled voltage-controlled oscillator consumes 6 mA at 2.5V and generates an oscillation frequency of 60 GHz.

Figure 10:
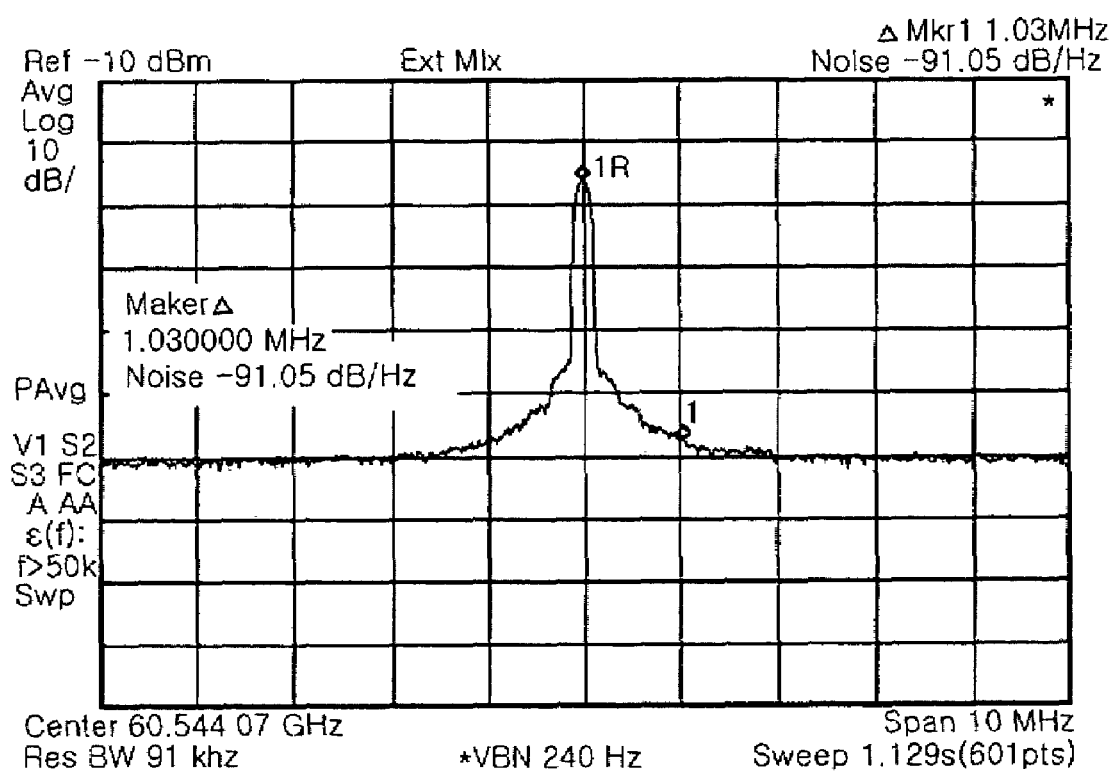
FIG. 10 is a graph illustrating a phase noise characteristic of the capacitive-degeneration double cross-coupled voltage-controlled oscillator of FIG. 9.

In addition, referring to FIG. 10, it can be seen that the phase noise of −91 dBc/Hz can be obtained at an offset frequency of 1 MHz.

According to the present invention, a capacitive-degeneration double cross-coupled voltage-controlled oscillator can more effectively increase a MAOF and decrease an input capacitance in millimeter-wave band. In addition, the capacitive-degeneration double cross-coupled voltage-controlled oscillator can be stably operated with overcoming influence of a parasitic resistance and a parasitic capacitance in a terahertz band as well as millimeter-wave band.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A voltage-controlled oscillator comprising:
   a main cross-coupled oscillating unit including first and second transistors cross-coupled to first and second output nodes of a resonating unit to perform an oscillation operation; and
   an auxiliary cross-coupled oscillating unit including third and fourth transistors cross-coupled to the first and second output nodes and the first and second transistors and a degeneration capacitor connected between emitters of the first and second transistors so as to form a positive-feedback loop capable of increasing a negative resistance and decreasing an input capacitance by the positive-feedback loop,
   wherein the positive-feedback loop is contributed to by the first transistor, the fourth transistor, the degeneration capacitor, the third transistor and the second transistor,
   wherein the auxiliary cross-coupled oscillating unit comprises:
   the third transistor having a collector connected to the base of the first transistor and a base connected to the emitter of the second transistor;
   the fourth transistor having a collector connected to the base of the second transistor and a base connected to the emitter of the first transistor;
   the degeneration capacitor connected between emitters of the third and fourth transistors; and
   a first current source connected to emitters of the third and fourth transistors.

2. The voltage-controlled oscillator of claim 1, wherein the main cross-coupled oscillating unit comprises:
   the first and second transistors of which bases are connected to the respective first and second output nodes of the resonating unit and of which collectors and bases are cross-coupled to each other; and
   a second current source connected to emitters of the first and second transistors.

3. The voltage-controlled oscillator of claim 2, wherein the resonating unit comprises:
   first and second inductors commonly connected to a supply voltage; and
   first and second NMOS varactors of which sources and drains are commonly connected to a tuning voltage and of which gates are connected to the respective first and second inductors.

4. The voltage-controlled oscillator of claim 1, wherein the main cross-coupled oscillating unit comprises:
   first and second coupling capacitances connected to the respective first and second output nodes;
   the first transistor having a base connected to the second output node of the resonating unit and a collector connected to a supply voltage;
   the second transistor having a base connected to the first output node of the resonating unit and a collector connected to the supply voltage; and
   a second current source connected to emitters of the first and second transistors.

5. The voltage-controlled oscillator of claim 4, further comprising first and second load impedances connected between the supply voltage and the collector of the first transistor and between the supply voltage and the collector of the second transistor, respectively.

6. The voltage-controlled oscillator of claim 4, wherein the resonating unit comprises:
   a bias resistance connected to a bias voltage;
   a center-tapped inductor connected to the bias resistance; and
   a varactor capacitance connected in parallel to the center-tapped inductor.

7. A voltage-controlled oscillator comprising:
   a main cross-coupled oscillating unit including first and second transistors cross-coupled to first and second output nodes of a resonating unit to perform an oscillation operation; and
   an auxiliary cross-coupled oscillating unit including third and fourth transistors cross-coupled to the first and second output nodes and the first and second transistors and a degeneration capacitor connected between emitters of the first and second transistors so as to form a positive-feedback loop capable of increasing a negative resistance and decreasing an input capacitance by the positive-feedback loop,
   wherein the positive-feedback loop is contributed to by the first transistor, the fourth transistor, the degeneration capacitor, the third transistor and the second transistor, and
   wherein the auxiliary cross-coupled oscillating unit comprises:
   the third transistor having a collector commonly connected to the base of the first transistor and the second output node and a base connected to the emitter of the second transistor;
   the fourth transistor having a collector commonly connected to the base of the second transistor and the first output node and a base connected to the emitter of the first transistor;
   a first current source connected to emitters of the third and fourth transistors; and
   wherein the degeneration capacitor is connected between emitters of the third and fourth transistors.

8. A voltage-controlled oscillator comprising:

a resonating unit having first and second output nodes;

a main cross-coupled oscillating unit configured to cooperate with the resonating unit and perform an oscillation operation, the main cross-coupled oscillating unit including:

a first transistor having a first base coupled to the first output node and a first collector coupled to the second output node, and a second transistor having a second base coupled to the second output node and a second collector coupled to the first output node; and an auxiliary cross-coupled oscillating unit configured to form a positive-feedback loop with the main cross-coupled oscillating unit in order to increase a negative resistance of the main cross-coupled oscillating unit, the auxiliary cross-coupled oscillating unit including:

a third transistor having a third collector coupled to the first base of the first transistor and a third base coupled to a second emitter of the second transistor, wherein the third base is configured to receive a signal from the second emitter, and a fourth transistor having a fourth collector coupled to the second base of the second transistor and a fourth base coupled to a first emitter of the first transistor, wherein the fourth base is configured to receive a signal from the first emitter.

9. The voltage-controlled oscillator of claim 8, wherein the main cross-coupled oscillating unit further comprises:

a second current source connected to the emitters of the first and second transistors.

10. The voltage-controlled oscillator of claim 9, wherein the auxiliary cross-coupled oscillating unit further comprises:

a first current source commonly connected to the emitters of the third and fourth transistors.

11. The voltage-controlled oscillator of claim 9, wherein the auxiliary cross-coupled oscillating unit further comprises:

a first current source connected to the emitters of the third and fourth transistors, respectively.

12. The voltage-controlled oscillator of claim 8, further comprising:

a degeneration capacitor provided between the third emitter and the fourth emitter.

13. The voltage-controlled oscillator of claim 8, wherein the third base and the second emitter are connected to a common node, and wherein the fourth base and the first emitter are connected to a common node.

* * * * *